(12) United States Patent
Chou et al.

(10) Patent No.: US 10,651,033 B1
(45) Date of Patent: May 12, 2020

(54) SEMICONDUCTOR DEVICE STRUCTURES AND METHODS FOR MANUFACTURING THE SAME

(71) Applicant: Vanguard International Semiconductor Corporation, Hsinchu (TW)

(72) Inventors: Cheng-Wei Chou, Taoyuan (TW); Hsin-Chih Lin, Hsinchu (TW); Yu-Chieh Chou, New Taipei (TW)

(73) Assignee: VANGUARD INTERNATIONAL SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 16/241,237

(22) Filed: Jan. 7, 2019

(51) Int. Cl.
    *H01L 21/02* (2006.01)
    *H01L 29/66* (2006.01)
    *H01L 29/778* (2006.01)

(52) U.S. Cl.
    CPC .... *H01L 21/02645* (2013.01); *H01L 21/0242* (2013.01); *H01L 21/0245* (2013.01); *H01L 21/0254* (2013.01); *H01L 21/02389* (2013.01); *H01L 21/02502* (2013.01); *H01L 21/02516* (2013.01); *H01L 29/66462* (2013.01); *H01L 29/7787* (2013.01); *H01L 21/02488* (2013.01)

(58) Field of Classification Search
    CPC ......... H01L 21/02645; H01L 21/02516; H01L 21/02389; H01L 21/0242; H01L 21/2033; H01L 21/3147; H01L 21/76297; H01L 39/2458; H01L 29/7787; H01L 21/0254; H01L 29/66462

See application file for complete search history.

(56) References Cited

U.S. PATENT DOCUMENTS

| 2006/0289876 | A1* | 12/2006 | Briere | H01L 21/0237 257/86 |
| 2007/0298592 | A1* | 12/2007 | Chyi | C30B 23/02 438/479 |
| 2014/0094005 | A1 | 4/2014 | Ramdani | |
| 2017/0033187 | A1 | 2/2017 | Rajan et al. | |

(Continued)

FOREIGN PATENT DOCUMENTS

| TW | M508782 U | 9/2015 |
| TW | 201724509 A | 7/2017 |

OTHER PUBLICATIONS

Wang et al. ("A novel method for the fabrication of AlGaN/GaN HEMTs on Si (111) substrates," Int. J. Adv. Manuf. Techn., 67, pp. 1491-1500, 2013) (Year: 2013).*

(Continued)

*Primary Examiner* — Yasser A Abdelaziez
(74) *Attorney, Agent, or Firm* — Birch, Stewart, Kolasch & Birch, LLP

(57) ABSTRACT

A method for manufacturing a semiconductor device structure is provided. The method includes providing a base substrate and forming a buffer layer on the base substrate. The method also includes forming a patterned silicon layer on the buffer layer. The patterned silicon layer has an opening to expose a portion of the buffer layer. The method further includes epitaxially growing a patterned channel layer and a patterned barrier layer on a top surface of the patterned silicon layer sequentially. In addition, the method includes forming a gate electrode on the patterned barrier layer.

20 Claims, 13 Drawing Sheets

(56) References Cited

U.S. PATENT DOCUMENTS

| | | |
|---|---|---|
| 2017/0069743 A1* | 3/2017 | Roberts ............. H01L 21/26506 |
| 2017/0117376 A1 | 4/2017 | Yang et al. |
| 2018/0174823 A1* | 6/2018 | Kim ................. H01L 21/02247 |
| 2018/0212399 A1* | 7/2018 | Menezo ................. H01S 5/125 |

OTHER PUBLICATIONS

Yang et al. ("GaN-on-patterned-silicon (GPS) technique for fabrication of GaN-based MEMS," Sensors and Actuators, A 130-131, pp. 371-378, 2006) (Year: 2006).*

* cited by examiner

US 10,651,033 B1

SEMICONDUCTOR DEVICE STRUCTURES AND METHODS FOR MANUFACTURING THE SAME

BACKGROUND

Field of the Disclosure

The embodiments of the disclosure relate to a semiconductor device structure, and in particular to a semiconductor device structure with a composite structure.

Description of the Related Art

In recent years, the development of semiconductor devices for use in computers, consumer electronics, and other fields has progressed rapidly. Currently, semiconductor device technology has been widely accepted in Metal-Oxide-Semiconductor Field-Effect Transistor (MOSFET) products that are marketed with a high market share.

Gallium nitride on silicon (GaN-on-Si) based devices have become an attractive option for power devices over the past few years. Gallium nitride transistor devices provide for a high electron mobility in a two-dimensional electron gas (2-DEG) located near the interface of a AlGaN and a GaN heterostructure interface. The high electron mobility provides for a good power gain at high frequencies used in radio frequency (RF) applications. However, existing semiconductor devices have not been satisfactory in every respect. Therefore, it is necessary to find a new high-voltage semiconductor device structure to solve the above problems.

SUMMARY

A method for manufacturing a semiconductor device structure is provided. The method includes providing a base substrate and forming a buffer layer on the base substrate. The method also includes forming a patterned silicon layer on the buffer layer. The patterned silicon layer has an opening to expose a portion of the buffer layer. The method further includes epitaxially growing a patterned channel layer and a patterned barrier layer on a top surface of the patterned silicon layer sequentially. In addition, the method includes forming a gate electrode on the patterned barrier layer.

A semiconductor device structure is provided. The semiconductor device structure includes a base substrate. The semiconductor device structure also includes a buffer layer disposed on the base substrate. The semiconductor device structure further includes a patterned silicon layer covering a portion of the buffer layer. In addition, the semiconductor device structure includes a channel layer disposed on a top surface of the patterned silicon layer. The semiconductor device structure also includes a barrier layer disposed on the channel layer so that a carrier channel would be formed in an interface between the channel layer and the barrier layer. The semiconductor device structure further includes a gate electrode disposed on the barrier layer.

A detailed description is given in the following embodiments with reference to the accompanying drawings.

BRIEF DESCRIPTION OF THE DRAWINGS

The disclosure may be more fully understood by reading the subsequent detailed description and examples with references made to the accompanying drawings, wherein.

DETAILED DESCRIPTION OF THE DISCLOSURE

Figure 1A:
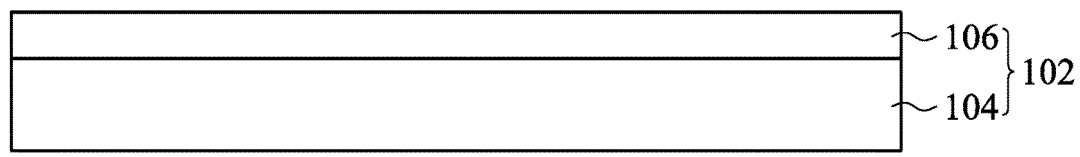
FIGS. 1A-1G are cross-sectional views of various stages of a process for manufacturing a semiconductor device structure in accordance with some embodiments of the present disclosure.

The semiconductor device structure of the present disclosure is described in detail in the following description. In the following detailed description, for purposes of explanation, numerous specific details and embodiments are set forth in order to provide a thorough understanding of the present disclosure. The specific elements and configurations described in the following detailed description are set forth in order to clearly describe the present disclosure. It will be apparent, however, that the exemplary embodiments set forth herein are used merely for the purpose of illustration, and the inventive concept may be embodied in various forms without being limited to those exemplary embodiments. In addition, the drawings of different embodiments may use like and/or corresponding numerals to denote like and/or corresponding elements in order to clearly describe the present disclosure. However, the use of like and/or corresponding numerals in the drawings of different embodiments does not suggest any correlation between different embodiments. In addition, in this specification, expressions such as "first material layer disposed on/over a second material layer", may indicate the direct contact of the first material layer and the second material layer, or it may indicate a non-contact state with one or more intermediate layers between the first material layer and the second material layer. In the above situation, the first material layer may not be in direct contact with the second material layer.

It should be noted that the elements or devices in the drawings of the present disclosure may be present in any form or configuration known to those skilled in the art. In addition, the expression "a layer overlying another layer", "a layer is disposed above another layer", "a layer is disposed on another layer" and "a layer is disposed over another layer" may indicate that the layer is in direct contact with the other layer, or that the layer is not in direct contact with the other layer, there being one or more intermediate layers disposed between the layer and the other layer.

In addition, in this specification, relative expressions are used. For example, "lower", "bottom", "higher" or "top" are used to describe the position of one element relative to another. It should be appreciated that if a device is flipped upside down, an element that is "lower" will become an element that is "higher".

The terms "about" and "substantially" typically mean +/−20% of the stated value, more typically +/−10% of the stated value, more typically +/−5% of the stated value, more typically +/−3% of the stated value, more typically +/−2% of the stated value, more typically +/−1% of the stated value and even more typically +/−0.5% of the stated value. The stated value of the present disclosure is an approximate value. When there is no specific description, the stated value includes the meaning of "about" or "substantially".

Unless defined otherwise, all technical and scientific terms used herein have the same meaning as commonly understood by one of ordinary skill in the art to which this disclosure belongs. It should be appreciated that, in each case, the term, which is defined in a commonly used dictionary, should be interpreted as having a meaning that conforms to the relative skills of the present disclosure and the background or the context of the present disclosure, and should not be interpreted in an idealized or overly formal manner unless so defined.

This description of the exemplary embodiments is intended to be read in connection with the accompanying drawings, which are to be considered part of the entire written description. The drawings are not drawn to scale. In addition, structures and devices are shown schematically in order to simplify the drawing.

It should also be noted that the present disclosure presents embodiments of a semiconductor device, and may be included in an integrated circuit (IC) such as a microprocessor, memory device, and/or other device. The IC may also include various passive and active microelectronic devices, such as thin film resistors, other capacitor (e.g. metal-insulator-metal capacitor, MIMCAP), inductors, diodes, metal-oxide-semiconductor field effect transistors (MOSFETs), complementary MOS (CMOS) transistors, bipolar junction transistors (BJTs), laterally diffused MOS (LDMOS) transistors, high power MOS transistors, or other types of transistors. One of ordinary skill may recognize that the high-voltage semiconductor devices may be used in other type of semiconductor elements.

Refer to FIGS. 1A-1G, which are cross-sectional a semiconductor device structure 100A in accordance with some embodiments of the present disclosure. In some embodiments, a composite substrate 102 is provided as shown in FIG. 1A. The composite substrate 102 may include a base substrate 104 and a buffer layer 106 that is formed on the base substrate 104. In some embodiments, the base substrate 104 may include ceramic material. The ceramic material may include metal inorganic material. In some embodiments, the base substrate 104 may include an AlN substrate, a sapphire substrate or another applicable substrate. The sapphire substrate may be composed of an aluminum oxide layer and a gallium nitride layer formed thereon. In some embodiments, the Young's modulus of the base substrate 104 is greater than that of silicon. For example, the Young's modulus of the base substrate 104 is in a range of about 200 GPa to about 1000 GPa. If Young's modulus of the base substrate 104 becomes greater, the semiconductor device structure can support more intensive stress. In some embodiments, toughness of the base substrate 104 is greater than that of the silicon. If toughness of the base substrate 104 becomes greater, the semiconductor device structure can support more weight, thereby resisting more stress. As a result, the thicker film may be formed on the base substrate 104 without breaking of it. In some embodiments, hardness of the base substrate 104 is greater than that of silicon. The greater hardness of the base substrate 104 assists in forming the thicker film.

As shown in FIG. 1A, the buffer layer 106 is formed on the base substrate 104. The buffer layer 106 is used as a spacer layer that is disposed between the base substrate 104 and a subsequently formed silicon layer. Formation of the buffer layer 106 may prevent the silicon layer from contacting the base substrate 104. The material of the buffer layer 106 may include silicon oxide, silicon oxynitride or another applicable material. FIG. 1A illustrates the composite substrate 102 is composed of the base substrate 104 and the buffer layer 106. However, the scope of the present disclosure is not limited thereto.

Figure 1B:
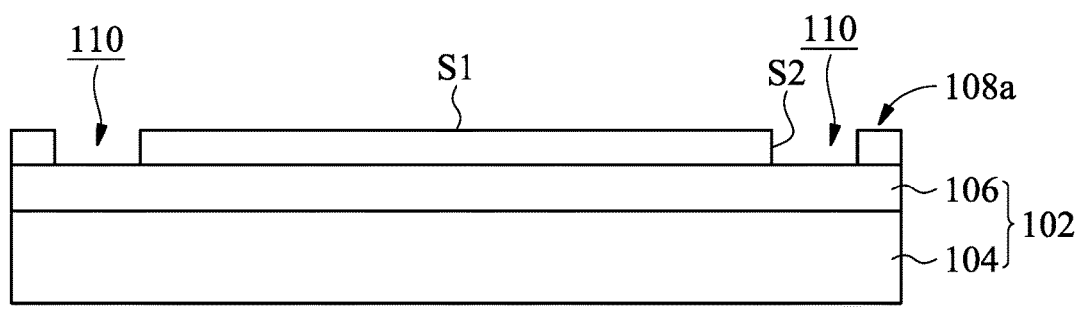

In some embodiments, a patterned silicon layer 108a is formed on the buffer layer 106 as shown in FIG. 1B. The patterned silicon layer 108a has an opening 110 to expose a portion of the top surface of the buffer layer 106. In some embodiments, a surface S1 of the patterned silicon layer 108a has (111) surface. In some embodiments, a silicon-containing material layer is formed on the buffer layer 106 by a depositing process. Next, a lithography process and an etching process are performed to pattern it. As a result, the patterned silicon layer 108a has the surface S1 and a surface S2 adjacent to the surface S1. The surface S1 has (111) surface, and the surface S2 does not have (111) surface. The surface S2 may be regarded as the side surface of the patterned silicon layer 108a. In some embodiments, the thickness of the patterned silicon layer 108a is in a range about of 300 nm to about 600 nm.

The silicon-containing material layer is formed using a selective epitaxy growth (SEG) process, a CVD process (e.g., a vapor-phase epitaxy (VPE) process, a low pressure CVD (LPCVD) process, and/or an ultra-high vacuum CVD (UHV-CVD) process), a molecular beam epitaxy process, deposition of doped amorphous semiconductor (e.g. Si, Ge or SiGe) followed by a solid-phase epitaxial recrystallization (SPER) step, another applicable process, or a combination thereof. The formation process of the silicon-containing material layer may use gaseous and/or liquid precursors such as $SiH_4$.

The photolithography process may include photoresist coating (e.g., spin-on coating), soft baking, mask alignment, exposure, post-exposure baking, developing the photoresist, rinsing and drying (e.g., hard baking). The photolithography process may also be implemented or replaced by another proper method such as maskless photolithography, electron-beam writing or ion-beam writing. The etching process may include dry etching, wet etching, and other etching methods.

Figure 1C:
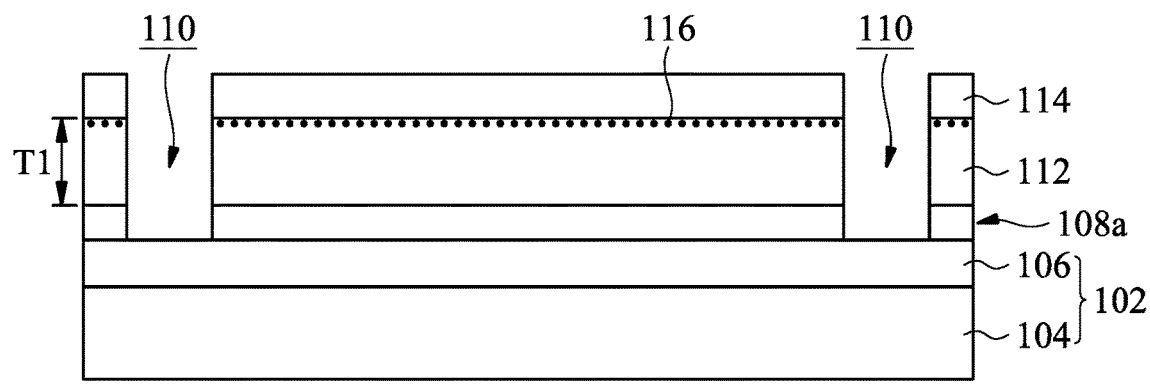

In some embodiments, a channel layer 112 and a barrier layer 114 are sequentially formed on the surface S1 of the patterned silicon layer 108a as shown in FIG. 1C. In some embodiments, the channel layer 112 and the barrier layer 114 are material layers with different band gaps. In some embodiments, the channel layer 112 and barrier layer 114 are compounds made from the III-V groups in the periodic table of elements. However, the channel layer 112 and the barrier layer 114 are different from each other in composition. In some embodiments, the channel layer 112 includes a gallium nitride (GaN) layer. The barrier layer 114 includes an aluminum gallium nitride layer (also referred to as $Al_xGa_{1-x}N$ layer, wherein 0<x<1). The channel layer 112 and the barrier layer 114 are in direct contact with each other. Since the channel layer 112 and the barrier layer 114 have different band gaps, a heterojunction is formed in the interface between the channel layer 112 and the barrier layer 114.

The channel layer 112 can be epitaxially grown by metal organic vapor phase epitaxy (MOVPE) using a gallium-containing precursor and a nitrogen-containing precursor. The gallium-containing precursor includes trimethylgallium (TMG), triethylgallium (TEG), or another suitable chemical. The nitrogen-containing precursor includes ammonia (NH₃), tertiarybutylamine (TBA), phenyl hydrazine, or another suitable chemical. In some embodiments, the channel layer 112 has a thickness T1 ranging from about 5 μm to about 20 μm. In some embodiments, the channel layer 112 has a thickness T1 ranging from about 7 μm to about 15 μm.

The thickness T1 may impact on the breakdown voltage of the semiconductor device structure 100A. The greater the thickness T1 of the channel layer 112 is, the greater the breakdown voltage of the semiconductor device structure 100A is. If the base substrate 104 were not used, the thickness T1 of the channel layer 112 would not be greater than 5 μm. When there is no base substrate 104 and the thickness of the channel layer 112 is greater than 5 μm, the semiconductor device structure 100A will have scraps due to the channel layer 112 being overweight. When the base substrate 104, whose Young's modulus is greater than silicon, is used as a support substrate, the thickness T1 of the channel layer 112 can be greater than 5 μm. In some cases, the thickness T1 of the channel layer 112 should not be greater than 20 μm. When the thickness T1 of the channel layer 112 is greater than 20 μm, the semiconductor device structure 100A will have scraps due to the channel layer 112 being overweight. In some embodiments, the use of the base substrate 104, whose Young's modulus is greater than silicon, may assist in forming the channel layer 112 with greater thickness, thereby improving the reliability of the semiconductor device structure 100A.

The barrier layer 114 is epitaxially grown on the channel layer 112. The barrier layer 114 can be epitaxially grown by MOVPE using an aluminum-containing precursor, a gallium-containing precursor, and a nitrogen-containing precursor. The aluminum-containing precursor includes trimethylaluminum (TMA), triethylaluminum (TEA), or another suitable chemical. The gallium-containing precursor includes TMG, TEG, or another suitable chemical. The nitrogen-containing precursor includes ammonia, TBA, phenyl hydrazine, or another suitable chemical. In some embodiments, the barrier layer 114 has a thickness ranging from about 5 μm to about 50 μm.

The band gap discontinuity between the barrier layer 114 and the channel layer 112, along with the piezo-electric effect, creates a carrier channel 116 of highly mobile conducting electrons at an interface between the barrier layer 114 and the channel layer 112. The carrier channel 116 is referred to as a two-dimensional electron gas (2-DEG).

The growth rate of GaN on (111) surface is much greater than that on surface not (111) surface. In some embodiments, the growth rate of the channel layer 112, which is made of GaN, on the surface S1 of the patterned silicon layer 108a is much greater than that on the surface S2. In addition, the channel layer 112 is not epitaxially grown on the carrier channel 116. Therefore, the pattern of the channel layer 112 formed by epitaxially growth is the same as or similar to that of the patterned silicon layer 108a. Moreover, the pattern of the barrier layer 114 formed by epitaxially growth is the same as or similar to that of the patterned silicon layer 108a.

Figure 1D:
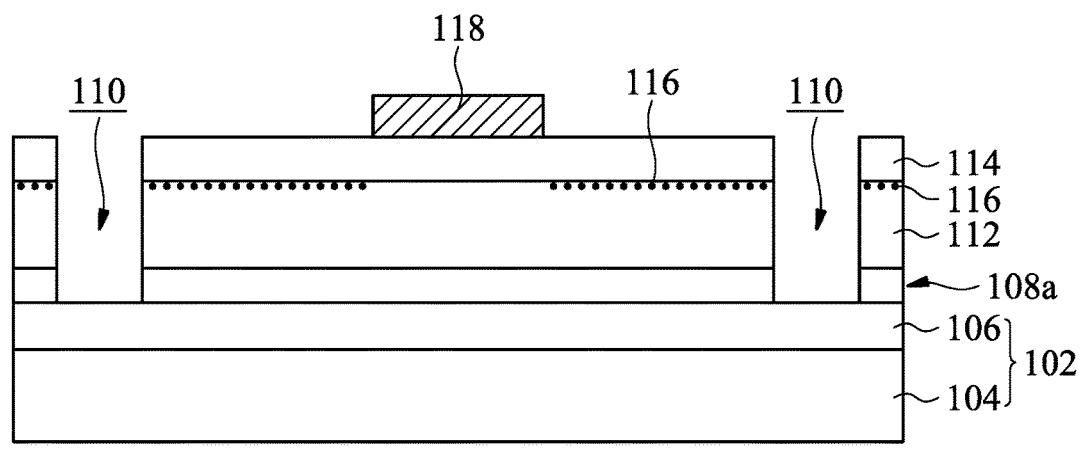

In some embodiments, the gate electrode 118 is formed on the barrier layer 114 as shown in FIG. 1D. In some embodiments, the gate electrode 118 includes p-type III-V compound or metal. In some embodiments, the p-type III-V compound includes p-type gallium nitride or other suitable material. Metal includes gold, platinum, rhodium, iridium, titanium, aluminum, copper, tantalum, tungsten, alloys, and other suitable materials. The gate electrode 118 is used to reduce the carrier concentration of the underlying 2-DEG such as the carrier channel 116 and raise the on-resistance of the semiconductor device structure 100A. In some embodiments, the thickness of the gate electrode 118 is in a range of about 50 nm to about 100 nm.

The gate electrode 118 may be formed by metal organic vapor-phase epitaxy (MOVPE), and patterned by a dry etching process. The dry etching process may include a reactive ion etching (RIE) process or high density plasma etching. In some embodiments, the etchant in the dry etching process may include a halide such as fluoride. Fluoride-containing etchant may include CH₃F, CH₂F₂, CHF₃, CF₄ or another applicable gas.

In some embodiments, after the formation of the gate electrode 118, the carrier concentration of the portion, which is directly under the gate electrode 118, of the carrier channel 116 is reduced and becomes very small. As a result, the concentration of the carrier under the gate electrode 118 may substantially be equal to zero. In this condition, when bias voltage is not performed on the semiconductor device structure 100A, the semiconductor device structure 100A is in a cut-off status. Accordingly, the semiconductor device structure 100A may be a normally off device.

Figure 1E:
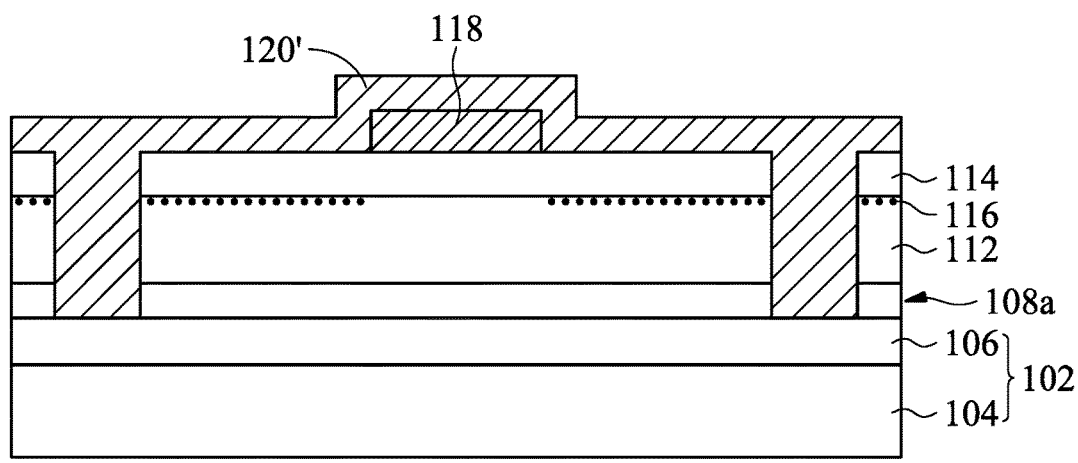

In some embodiments, a conductive material 120' is deposited on the barrier layer 114 and the carrier channel 116 as shown in FIG. 1E. In addition, the conductive material 120' is filled into the opening 110. In some embodiments, the conductive material 120' may include doped polysilicon or metal. The conductive material 120' may be deposited by a chemical vapor deposition (CVD) process, a physical vapor deposition (PVD) process, or another applicable deposition process.

In some embodiments, the portion of the material of the conductive material 120' that is over the top surface of the barrier layer 114 is removed so as to form a conductive layer 120 on the surface of the buffer layer 106. Moreover, the conductive layer 120 is located in the opening 110. In some embodiments, an etching process, a planarization process and/or an etching back process are performed on the conductive material 120' to thin the conductive layer 120 so that the portion, over the top surface of the barrier layer 114, of the conductive material 120' may be removed, thereby forming the conductive layer 120. The planarization process may include a CMP process, a grinding process, an etching process, another applicable process, or a combination thereof.

Figure 1F:
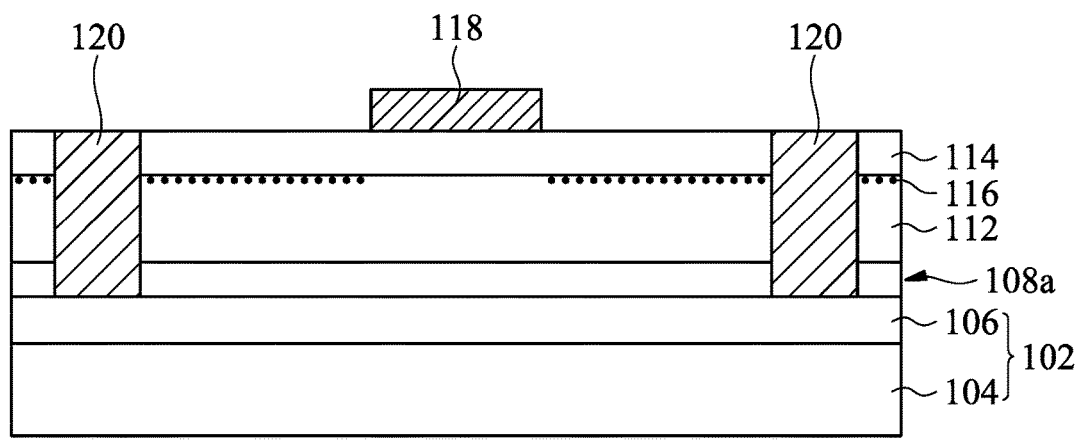

As shown in FIG. 1F, the conductive layer 120 penetrates the patterned silicon layer 108a, the channel layer 112 and the barrier layer 114. In addition, the conductive layer 120 is in direct contact with the top surface of the composite substrate 102 such as the buffer layer 106. In some cases, unpatterned silicon layer, channel layer and barrier layer are formed first, and then an etching process is performed to pattern them so as to form a trench. In this condition, it may not be easy to form the trench with high aspect ratio.

In the embodiment of the present disclosure, even the etching process, used to pattern the channel layer 112 and the barrier layer 114, is not performed, both of them may have pattern similar to or the same as that of the patterned silicon layer 108a. In addition, the aspect ratio of the opening 110 becomes greater as the channel layer 112 and the barrier layer 114 are formed. In this embodiment, the opening 110 with high aspect ratio may be formed easily.

Figure 1G:
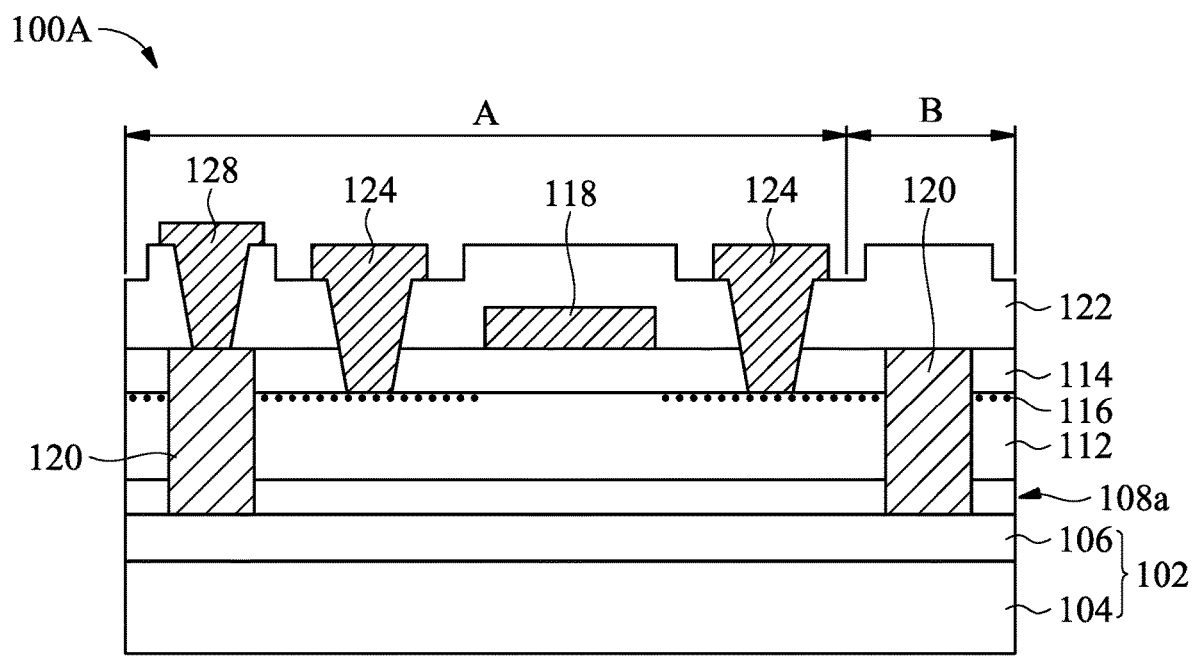

In some embodiments, a dielectric layer 122, a source/drain structure 124 and a wire 128 are formed as shown in FIG. 1G. In some embodiments, a semiconductor material (not shown) is deposited on the barrier layer 114 and the conductive layer 120 before the dielectric layer 122 is formed. A patternized process is performed so that the portion, directly on the conductive layer 120, of the semiconductor material may remain. As a result, the semiconductor material protrudes over the top surface of the barrier layer 114. Next, the dielectric layer 122 is formed on the barrier layer 114, the conductive layer 120 and the gate electrode 118. The material of the dielectric layer 122 may include, but is not limited to, silicon oxide, silicon nitride, silicon oxynitride, low-k material, any other suitable dielectric material, or a combination thereof. The dielectric layer 122 may be formed by CVD, PVD, atomic layer deposition (ALD) process, spin-on coating, sputtering or another applicable process.

After the dielectric layer 122 is deposited, a lithography process and an etching process are performed to remove a portion of the dielectric layer 122 and the barrier layer 114 so as to form trenches (not shown). Next, a conductive material is filled into the trenches so as to form the source/drain structure 124 and the wire 128. The source/drain structure 124 is formed at two opposite sides of the gate electrode 118 and in direct contact with the carrier channel 116. The source/drain structure 124 may include one or more metal materials. The source/drain structure 124 may include metal, such as copper, titanium, aluminum, nickel, gold or other suitable materials. The source/drain structure 124 may be formed by CVD, PVD, ALD, spin-on coating, sputtering, or another applicable process.

The wire 128 may include tungsten, aluminum, nickel, gold, platinum, titanium, or other suitable materials. The wire 128 may be formed by CVD, PVD, ALD, spin-on coating, sputtering or another applicable process. The material of the wire 128 may be the same as or similar to that of the source/drain structure 124. In some embodiments, the step of forming the source/drain structure 124 may be the same as that of the wire 128. Many variations and/or modifications can be made to embodiments of the disclosure. In other embodiments, the step of forming the source/drain structure 124 may be different from that of the wire 128.

In some embodiments, the semiconductor device structure 100A includes a main device area A and a scribe line area B. As shown in FIG. 1G, the wire 128 is formed on and electrically connected to the conductive layer 120 in the main device area A. The wire 128 is not formed on the scribe line area B. In some embodiments, a cutting process is performed on the region that is between the conductive layer 120 and the source/drain structure 124 in the scribe line area B so that the main device area A may be separated from the scribe line area B.

FIG. 1G illustrates a portion of the source/drain structure 124 is embedded in the barrier layer 114. Many variations and/or modifications can be made to embodiments of the disclosure. In other embodiments, the source/drain structure 124 may penetrate the barrier layer 114 and the channel layer 112.

In some embodiments, the base substrate 104, whose Young's modulus is greater than silicon, is provided so that the thicker channel layer 112 may be formed without leaving scraps. As a result, reliability and breakdown voltage of the semiconductor device structure 100A are improved. In addition, the patterned silicon layer 108a, which has (111) top surface, is formed before the formation of the channel layer 112. As a result, the patterns of the channel layer 112 and the barrier layer 114, which are subsequently formed, are the same as or similar to that of the patterned silicon layer 108a. By using the method mentioned above may result in forming the opening 110 with high aspect ratio easily. Accordingly, the formation of the thicker channel layer 112 does not influence difficulty of forming the opening 110 with high aspect ratio.

Figure 2:
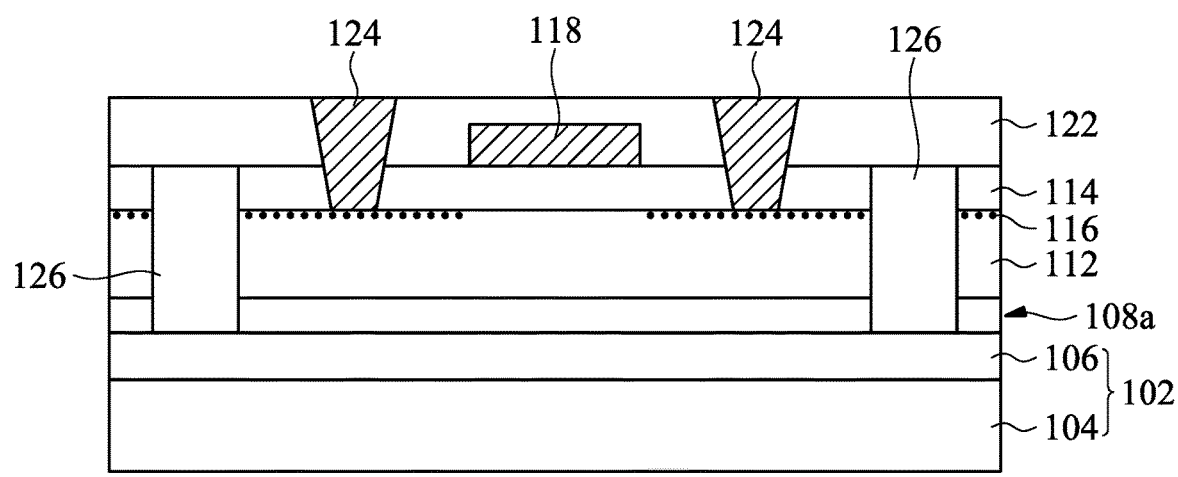
FIG. 2 is a cross-sectional view of a semiconductor device structure in accordance with some embodiments of the present disclosure.

FIGS. 1F and 1G illustrate that the conductive layer 120 penetrates the patterned silicon layer 108a, the channel layer 112 and the barrier layer 114. Many variations and/or modifications can be made to embodiments of the disclosure. Refer to FIG. 2, which is a cross-sectional view of a semiconductor device structure 100B in accordance with some embodiments of the present disclosure. The structure of the semiconductor device structure 100B may be the same as or similar to the semiconductor device structure 100A, and one of the differences is that the semiconductor device structure 100B includes a isolating region 126 that replaces the conductive layer 120.

In some embodiments, the material of the isolating region 126 may include silicon oxide, silicon nitride, silicon oxynitride, spin-on glass, low-k material, any other suitable dielectric material, or a combination thereof. In some embodiments, each of the isolating region 126 may have multi-layered structure. In some embodiments, the isolating region 126 may be formed by CVD, PVD or another applicable process.

Figure 3A:
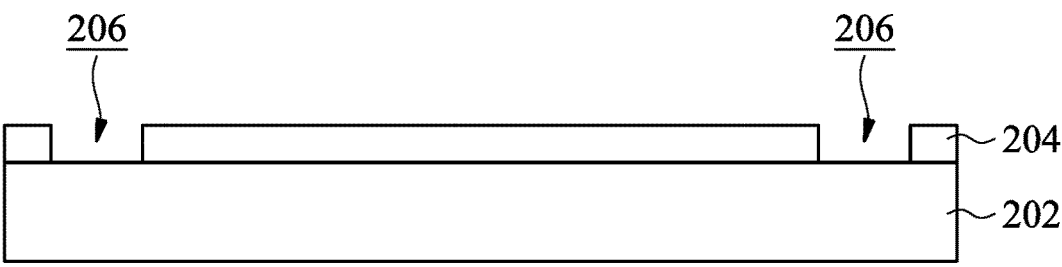
FIGS. 3A-3F are cross-sectional views of various stages of a process for manufacturing a semiconductor device structure in accordance with some embodiments of the present disclosure.

Refer to FIGS. 3A-3F, which are cross-sectional views of various stages of a process for manufacturing a semiconductor device structure 100C in accordance with some embodiments of the present disclosure. In some embodiments, a silicon substrate 202 is provided. The silicon substrate 202 may be a substrate containing silicon, a semiconductor-on-insulator (SOI) structure or another applicable substrate. The silicon substrate 202 is used to form the patterned silicon layer. In some embodiments, the silicon substrate 202 has a (111) surface. As shown in FIG. 3A, a patterned mask 204 is formed on the silicon substrate 202. The patterned mask 204 may be a photoresist. The patterned mask 204 may be formed on the silicon substrate 202 by a photography process. In addition, the patterned mask 204 has openings 206 to expose a portion of surface of the silicon substrate 202.

Figure 3B:
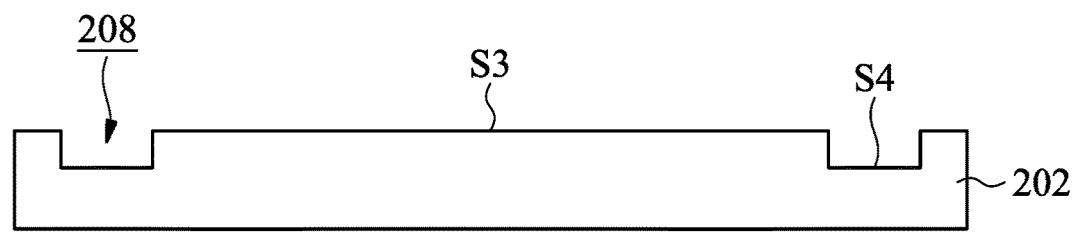

In some embodiments, an etching process is performed to form recesses 208 that correspond to the openings 206 as shown in FIG. 3B. In some embodiments, the silicon substrate 202 has a surface S3 that is not etched, and a surface S4 that is located in the recess 208.

In some embodiments, an ion implantation process 210 is performed so as to form a doped region 212 that is adjacent to the surface S3 and a doped region 214 that is adjacent to the surface S4. In some embodiments, one or more applicable dopants are implanted to the silicon substrate 202. The dopant may include hydrogen, boron, nitrogen or other elements. In some embodiments, one or more applicable ion implantation processes are performed to form the doped region 212 and the doped region 214.

Figure 3C:
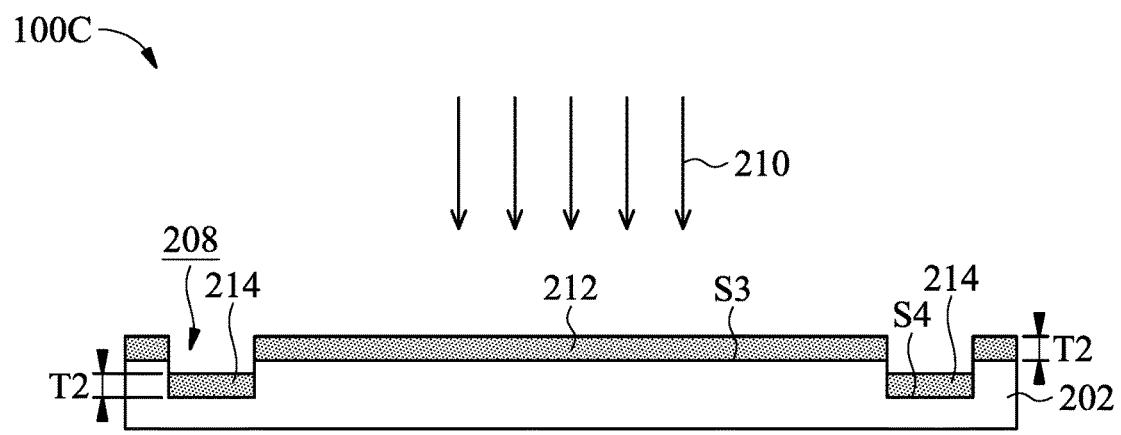

As shown in FIG. 3C, the doped region 212 and the doped region 214 may have the thickness T2. The thickness T2 may depend on that of the subsequently formed patterned silicon layer. In some embodiments, the thickness T2 is in a range of about 400 nm to about 700 nm. In some embodiments, the doped region 212 extends from the surface S3 to a distance that is substantially equal to the thickness T2. The doped region 214 extends from the surface S4 to a distance that is substantially equal to the thickness T2. In some embodiments, the doping concentration of the doped region 212 and the doped region 214 may be in a range of about $10^{18}$ atoms/cm$^3$ to about $10^{21}$ atoms/cm$^3$. In some embodiments, the doped region 212 is not in direct contact with the doped region 214.

Si—Si bonds located within the doped region 212 and the doped region 214 are broken due to the ion implantation process. In addition, Si—Si bonds at the interface between the doped region 212 and undoped region are also broken so that the bonding strength between the doped region 212 and the undoped region become weak. Therefore, the formation of the doped region 212 and the doped region 214 may assist in separating the doped region from the undoped region of the silicon substrate 202.

Figure 3D:
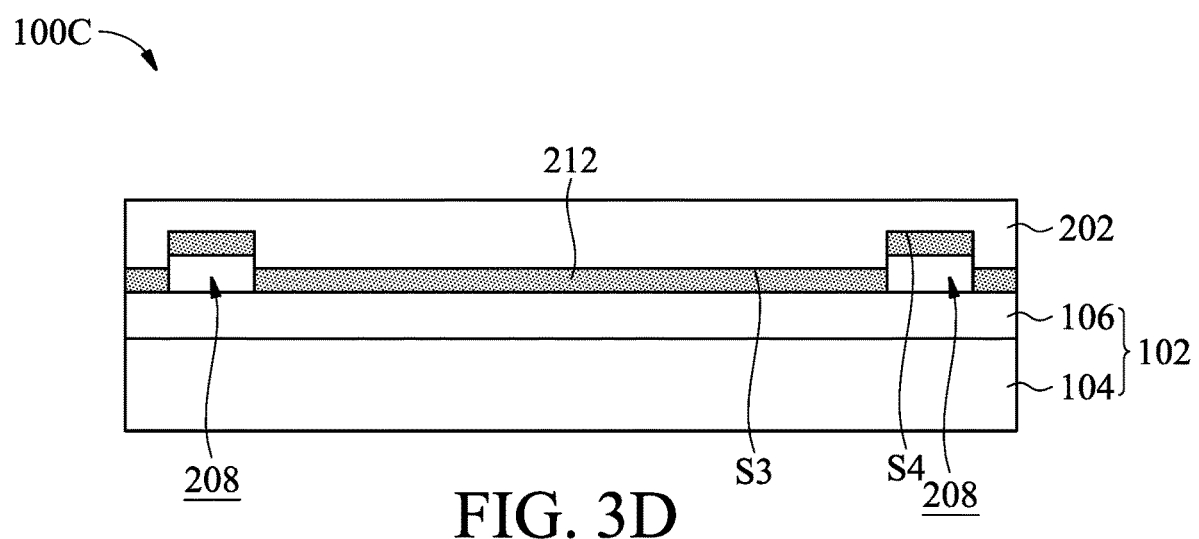

In some embodiments, the silicon substrate 202 is attached to the buffer layer 106 of the composite substrate 102. In some embodiments, the surface S3 is attached to the top surface of the composite substrate 102 such as the buffer layer 106, and the surface S4 is not attached to the composite substrate 102. As shown in FIG. 3D, the doped region 212 of the silicon substrate 202 is in contact with the buffer layer 106, and the recess 208 is between the doped region 214 and the buffer layer 106. In some embodiments, after the silicon substrate 202 is attached to the composite substrate 102, an anneal process is performed.

Figure 3E:
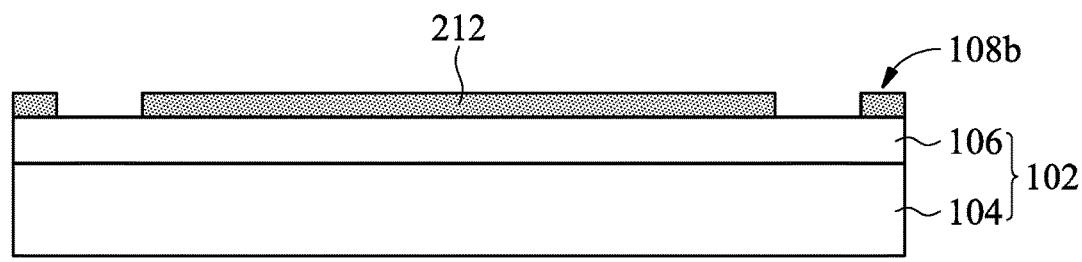
Figure 3F:
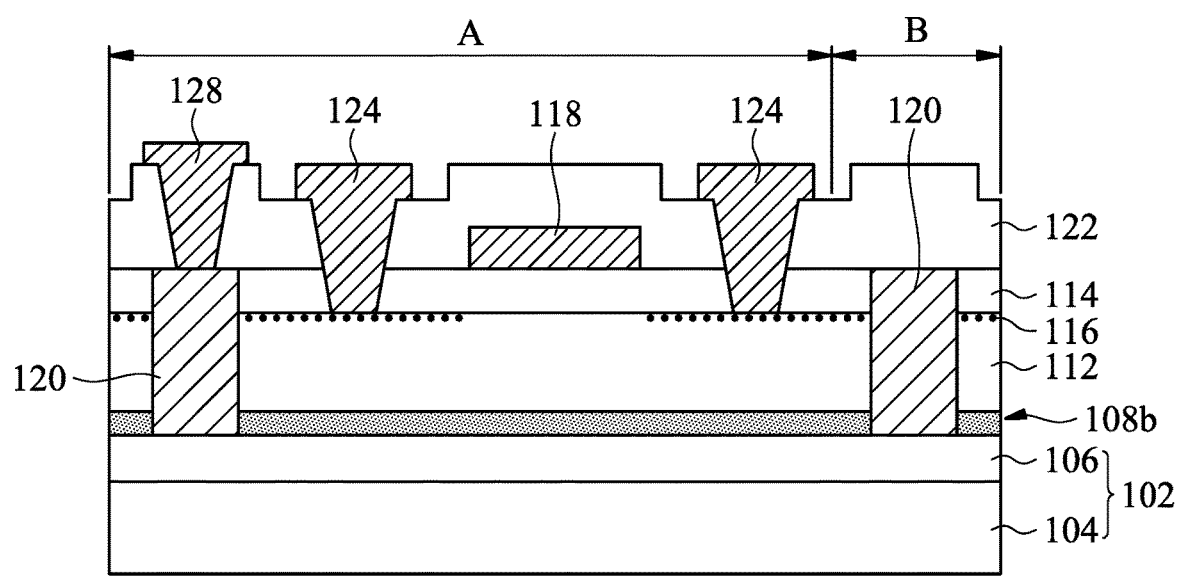

In some embodiments, the silicon substrate 202 is removed and the doped region 212 remains on the composite substrate 102 as shown in FIG. 3E. As a result, the patterned silicon layer 108b is formed. Since the Si—Si bonds at the interface between the doped region 212 and the undoped region are broken, the doped region 212 may be separated from the undoped region of the silicon substrate 202 by physical methods. In this embodiment, the condition of the ion implantation process 210 and the pattern of the patterned mask 204 may be tuned so that the pattern and the thickness of the patterned silicon layer 108b may be modified. In some embodiments, after the patterned silicon layer 108b is formed, a cleaning process is performed. For example, hydrofluoric acid may be used to treat the top surface, such as the surface S3, of the patterned silicon layer 108b.

In some embodiments, the channel layer 112, the barrier layer 114, the gate electrode 118, the conductive layer 120, the dielectric layer 122, the source/drain structure 124 and the wire 128 are formed so as to form the semiconductor device structure 100C. The materials and processing steps from FIG. 3E to FIG. 3F may be similar to the previously described embodiment in FIGS. 1B-1G, and thus, the description is not repeated herein.

Refer to FIGS. 4A-4D, which are cross-sectional views of various stages of a process for manufacturing a semiconductor device structure 100D in accordance with some embodiments of the present disclosure. The materials and processing steps to arrive at the intermediate structure illustrated in FIG. 4A may be similar to the previously described embodiment in FIGS. 3A-3B, and thus, the description is not repeated herein.

In some embodiments, an ion implantation process 216 is performed so as to form a doped region 212' that is adjacent to the surface S3 and a doped region 214' that is adjacent to the surface S4. In some embodiments, one or more applicable dopants are implanted to the silicon substrate 202. The dopant may include hydrogen, boron, nitrogen or other elements. In some embodiments, one or more applicable ion implantation processes are performed to form the doped region 212' and the doped region 214'.

In some embodiments, the portion on the surface S3 is an undoped portion 202a of the silicon substrate 202. In some embodiments, the portion 202a is separated from the silicon substrate 202 through the doped region 212'. In this embodiment, there is a distance D1 between the surface S3 and the interface I1, which is between the doped region 212' and the undoped region. In addition, there is a distance D2 between the surface S3 and the interface I2, which is between the doped region 212' and another undoped region. The distance D1 and the distance D2 may be controlled so as to determine the thickness of subsequently formed patterned silicon layer. In some embodiments, the doped region 212' is not in contact with the doped region 214'.

As mentioned above, the Si—Si bonds at the interface between the doped region 212' and the undoped region are broken. Therefore, the formation of the doped region 212' and the doped region 214' may assist in separating the doped region from the undoped region of the silicon substrate 202.

Figure 4A:
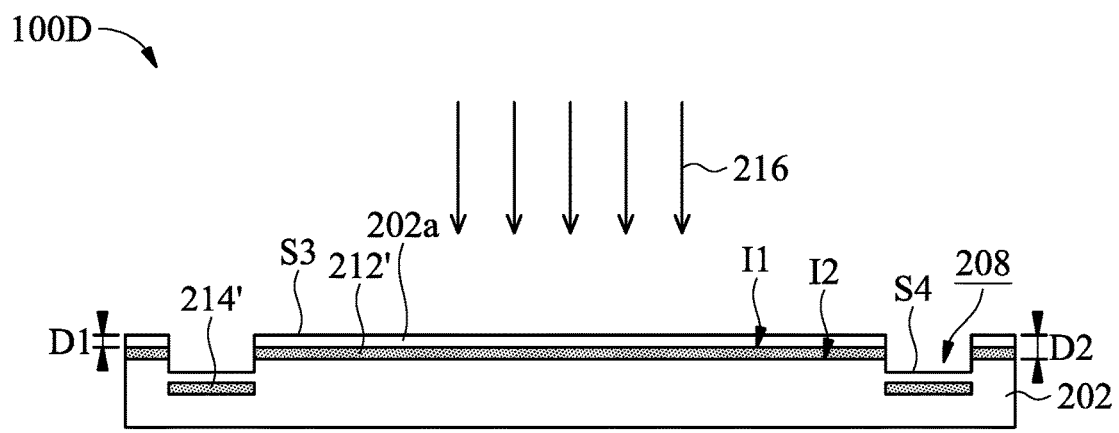
FIGS. 4A-4D are cross-sectional views of various stages of a process for manufacturing a semiconductor device structure in accordance with some embodiments of the present disclosure.
Figure 4B:
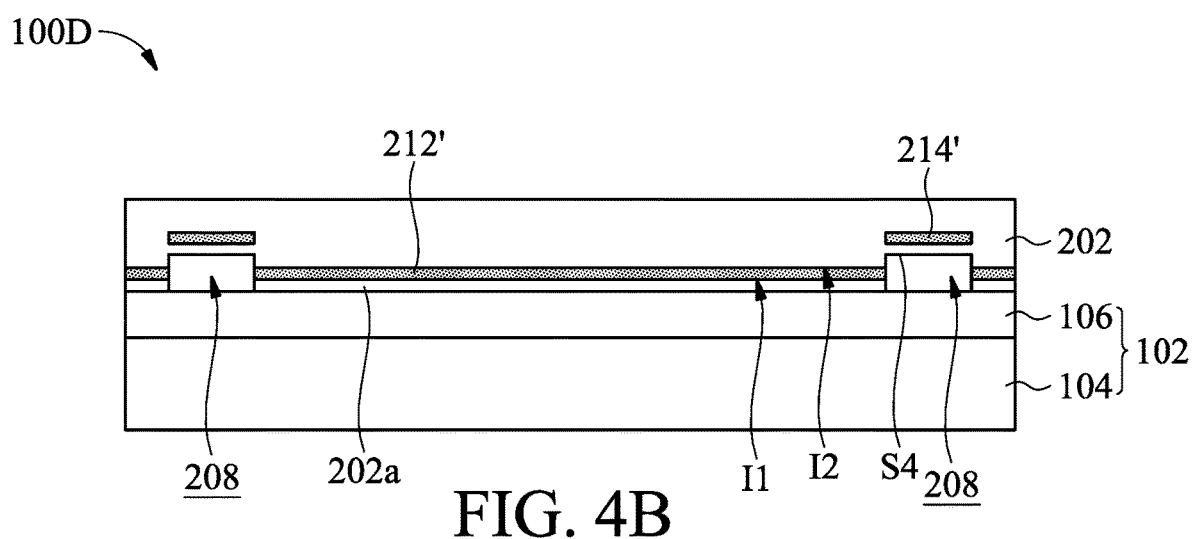

In some embodiments, the silicon substrate 202 is attached to the buffer layer 106 of the composite substrate 102 as shown in FIG. 4B. In some embodiments, the surface S3 is attached to the buffer layer 106, and the surface S4 is not in contact with the composite substrate 102. As shown in FIG. 4B, the composite substrate 102 is in contact with the portion 202a but not the doped region 212'.

Figure 4C:
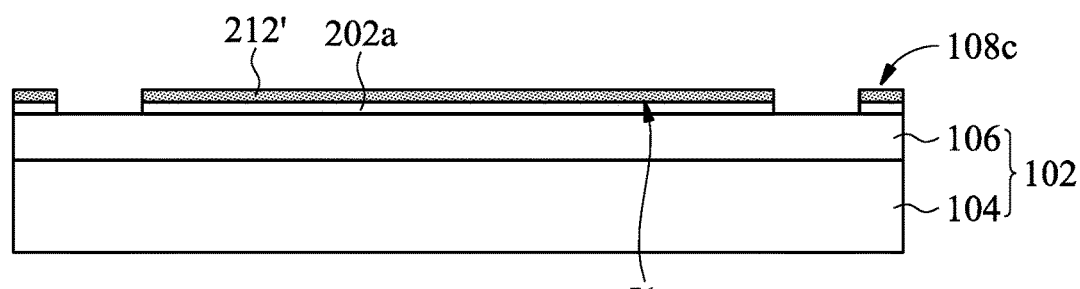

In some embodiments, the silicon substrate 202 is removed. The doped region 212' and the portion 202a remain on the composite substrate 102 as shown in FIG. 4C. As a result, the patterned silicon layer 108c is formed. In some embodiments, the patterned silicon layer 108c includes the doped region 212, which contains dopant, and the undoped portion 202a. Since the Si—Si bonds at the interface I2 between the doped region 212' and the undoped region are broken, the doped region 212' may be separated from the undoped region of the silicon substrate 202 by physical methods. Many variations and/or modifications can be made to embodiments of the disclosure. In some embodiments, the doped region 212' and the silicon substrate 202 are removed, and the portion 202a remains on the composite substrate 102. In some embodiments, the patterned silicon layer 108c is not doped.

Figure 4D:
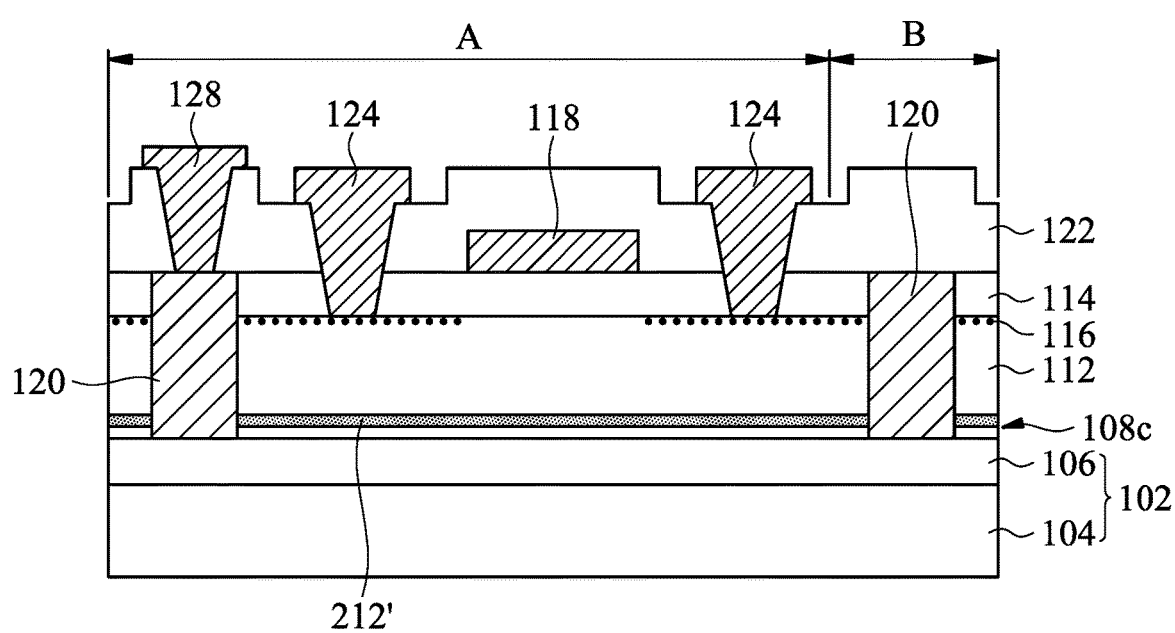

In some embodiments, the channel layer 112, the barrier layer 114, the gate electrode 118, the conductive layer 120, the dielectric layer 122, the source/drain structure 124 and the wire 128 are formed so as to form the semiconductor device structure 100D as shown in FIG. 4D. The materials and processing steps from FIG. 4C to FIG. 4D may be similar to the previously described embodiment in FIGS. 1B-1G, and thus, the description is not repeated herein.

Figure 5A:
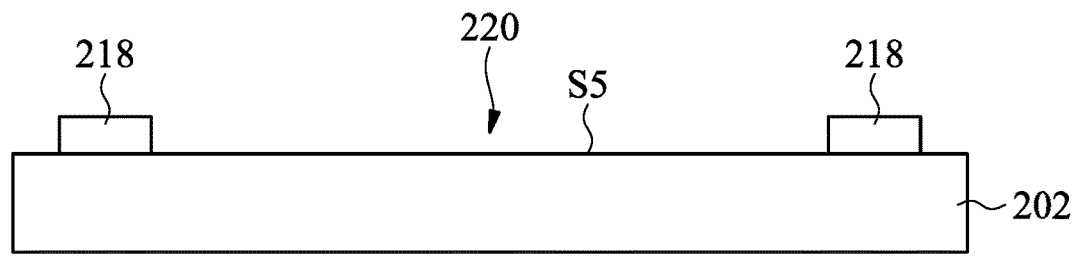
FIGS. 5A-5E are cross-sectional views of various stages of a process for manufacturing a semiconductor device structure in accordance with some embodiments of the present disclosure.

FIGS. 5A-5E are cross-sectional views of various stages of a process for manufacturing a semiconductor device structure 100E in accordance with some embodiments of the present disclosure. In some embodiments, a patterned mask 218 is formed on the silicon substrate 202 as shown in FIG. 5A. The patterned mask 218 may be a photoresist. The patterned mask 218 may be formed on the silicon substrate 202 by a photography process. In addition, the patterned mask 218 has an opening 220 to expose a portion of surface S5 of the silicon substrate 202.

In some embodiments, an ion implantation process 222 is performed so as to form a doped region 224 that is adjacent to the surface S5. In some embodiments, one or more applicable dopants are implanted to the silicon substrate 202. The dopant may include hydrogen, boron, nitrogen or other elements. In some embodiments, one or more applicable ion implantation processes are performed to form the doped region 224.

Figure 5B:
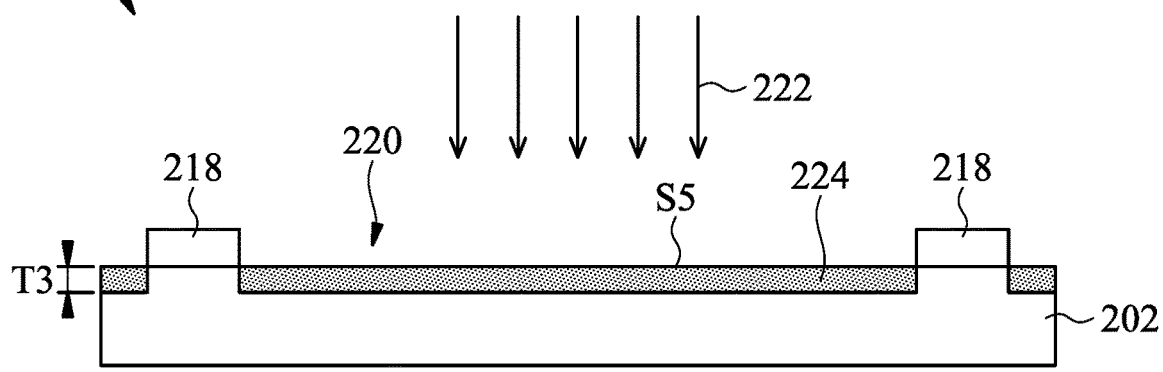

As shown in FIG. 5B, the doped region 224 may have the thickness T3. The thickness T3 may depend on that of the subsequently formed patterned silicon layer. In some embodiments, the thickness T3 is in a range of about 400 nm to about 700 nm. In some embodiments, the doped region 224 extends from the surface S5 to a distance that is substantially equal to the thickness T3. In some embodiments, the doping concentration of the doped region 224 may be in a range of about $10^{18}$ atoms/cm$^3$ to about $10^{21}$ atoms/cm$^3$.

As mentioned, the Si—Si bonds at the interface between the doped region 224 and the undoped region are broken. Therefore, the formation of the doped region 224 may assist in separating the doped region 224 from the undoped region of the silicon substrate 202.

Figure 5C:
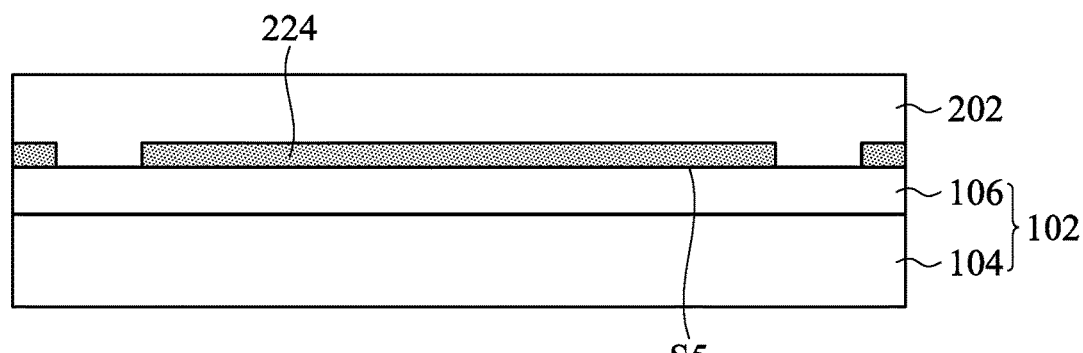

In some embodiments, the silicon substrate 202 is attached to the buffer layer 106 of the composite substrate 102 as shown in FIG. 5C. In some embodiments, the surface S5 is attached to the buffer layer 106. As shown in FIG. 5C, the doped region 224 and a portion of the silicon substrate 202 are attached to the composite substrate 102, and are in direct contact with the composite substrate 102.

Figure 5D:
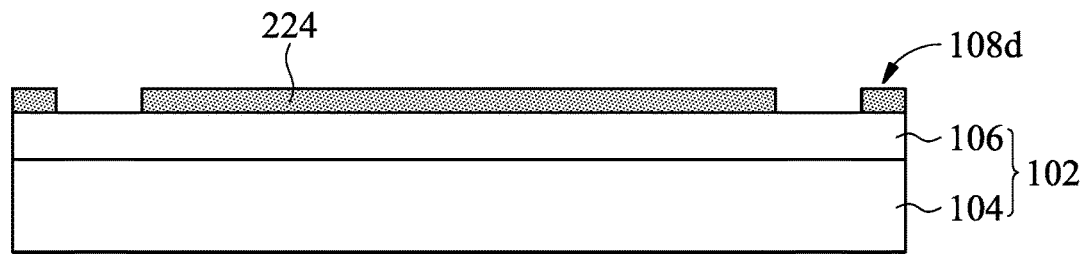

In some embodiments, the silicon substrate 202 is removed and the doped region 224 remains on the composite substrate 102 as shown in FIG. 5D. As a result, the patterned silicon layer 108d is formed. Since the Si—Si bonds at the interface between the doped region 224 and the undoped region are broken, the doped region 224 may be separated from the undoped region of the silicon substrate 202 by physical methods.

Figure 5E:
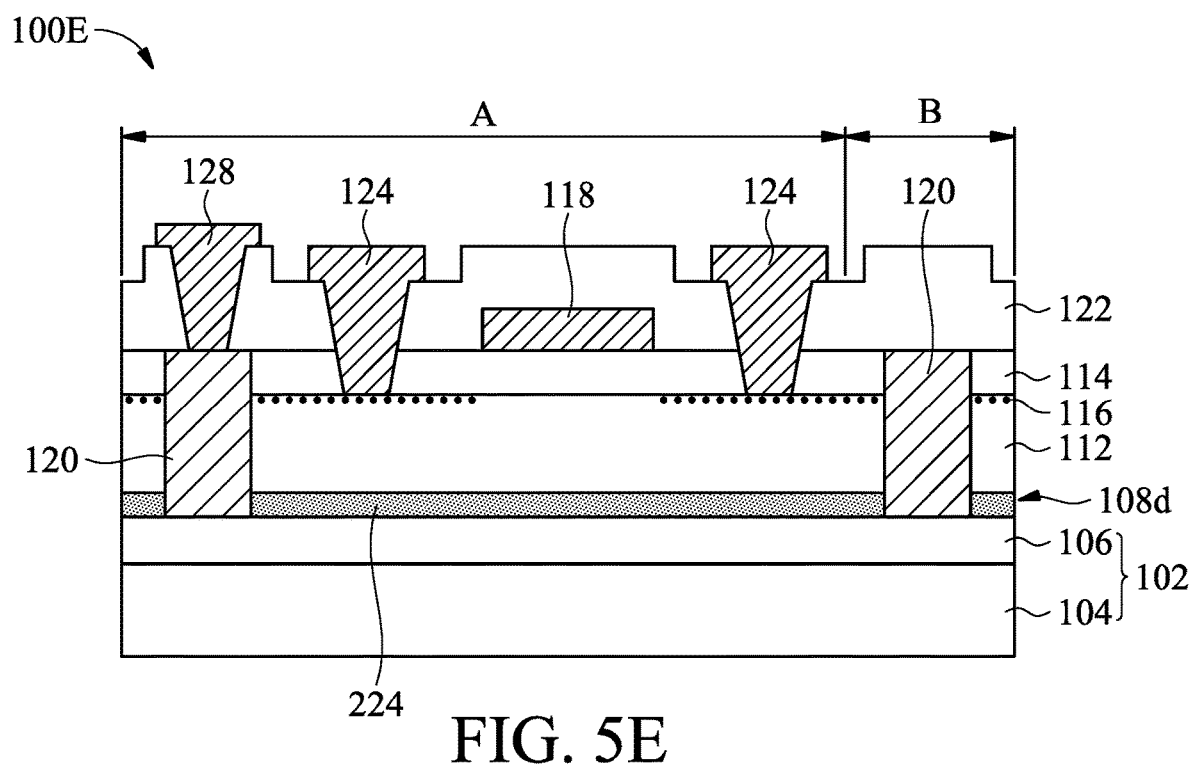

In some embodiments, the channel layer 112, the barrier layer 114, the gate electrode 118, the conductive layer 120, the dielectric layer 122, the source/drain structure 124 and the wire 128 are formed so as to form the semiconductor device structure 100E as shown in FIG. 5E. The materials and processing steps to arrive at the intermediate structure illustrated in FIGS. 5D-5E may be similar to the previously described embodiment in FIGS. 1B-1G, and thus, the description is not repeated herein.

Although some embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method for manufacturing a semiconductor device structure, comprising:
   providing a base substrate;
   forming a buffer layer on the base substrate;
   forming a patterned silicon layer on the buffer layer, wherein the patterned silicon layer has an opening to expose a portion of the buffer layer;
   epitaxially growing a patterned channel layer and a patterned barrier layer on a top surface of the patterned silicon layer sequentially so that a carrier channel is formed at an interface between the patterned channel layer and the patterned barrier layer; and
   forming a gate electrode on the patterned barrier layer.

2. The method as claimed in claim 1, wherein the base substrate comprises an AlN substrate or a sapphire substrate.

3. The method as claimed in claim 1, wherein the Young's modulus of the base substrate is greater than that of the patterned silicon layer.

4. The method as claimed in claim 1, further comprising:
   depositing an insulating material into the opening so as to form an isolating region that penetrates the patterned barrier layer, the patterned channel layer and the patterned silicon layer.

5. The method as claimed in claim 1, further comprising:
   depositing a conductive material into the opening so as to form a conductive layer that penetrates the patterned barrier layer, the patterned channel layer and the patterned silicon layer.

6. The method as claimed in claim 1, wherein the step of forming the patterned silicon layer comprises:
   forming a silicon-containing material layer on the buffer layer; and
   performing an etching process on the silicon-containing material layer so as to form the opening and the patterned silicon layer.

7. The method as claimed in claim 1, wherein the step of forming the patterned silicon layer comprises:
   providing a silicon substrate;
   performing an ion implantation process so as to form a patterned doped region in the silicon substrate;
   attaching the silicon substrate to the buffer layer; and
   removing the silicon substrate so that the patterned doped region remains on the buffer layer to form the patterned silicon layer.

8. The method as claimed in claim 7, further comprising:
   forming a patterned mask on the silicon substrate so as to expose a portion of a first surface of the silicon substrate;
   performing an etching process on the portion of the silicon substrate so as to pattern the first surface, thereby forming a patterned first surface; and
   removing the patterned mask, wherein the patterned doped region is formed in the patterned first surface of the silicon substrate.

9. The method as claimed in claim 8, further comprising:
   attaching the patterned first surface of the silicon substrate to the buffer layer.

10. The method as claimed in claim 7, further comprising:
    forming a patterned mask on the silicon substrate so as to expose a portion of the silicon substrate;
    forming the patterned doped region in a first surface of the silicon substrate by the ion implantation process, wherein the patterned doped region corresponds the portion of the silicon substrate;
    removing the patterned mask;
    attaching the first surface of the silicon substrate to the buffer layer; and
    removing the silicon substrate so that the patterned doped region remains on the buffer layer.

11. A semiconductor device structure, comprising:
    a base substrate;
    a buffer layer disposed on the base substrate;
    a patterned silicon layer covering a portion of the buffer layer;
    a channel layer disposed on a top surface of the patterned silicon layer;

a barrier layer disposed on the channel layer, wherein a carrier channel formed at an interface between the channel layer and the barrier layer; and a gate electrode disposed on the barrier layer.

12. The semiconductor device structure as claimed in claim 11, wherein the base substrate comprises an AlN substrate or a sapphire substrate.

13. The semiconductor device structure as claimed in claim 11, wherein the Young's modulus of the base substrate is greater than that of the patterned silicon layer.

14. The semiconductor device structure as claimed in claim 11, further comprising:

an isolating region that penetrates the barrier layer, the channel layer and the patterned silicon layer.

15. The semiconductor device structure as claimed in claim 11, further comprising:

a conductive layer that penetrates the barrier layer, the channel layer and the patterned silicon layer.

16. The semiconductor device structure as claimed in claim 11, wherein a thickness of the channel layer is in a range about 5 μm to about 20 μm.

17. The semiconductor device structure as claimed in claim 11, wherein the patterned silicon layer has a doped region.

18. The semiconductor device structure as claimed in claim 17, wherein the doped region is disposed at a surface of the patterned silicon layer that is far from the base substrate.

19. The semiconductor device structure as claimed in claim 11, wherein the top surface of the patterned silicon layer is (111) surface.

20. The semiconductor device structure as claimed in claim 11, wherein the channel layer comprises GaN, and the barrier layer comprises AlGaN.

* * * * *